(12) United States Patent
Yoshida

(10) Patent No.: US 9,591,751 B2
(45) Date of Patent: Mar. 7, 2017

(54) CONDUCTIVE SHEET AND METHOD FOR FABRICATING THE SAME

(71) Applicant: Takanori Yoshida, Kyoto (JP)

(72) Inventor: Takanori Yoshida, Kyoto (JP)

(73) Assignee: NISSHA PRINTING CO., LTD, Kyoto-Shi, Kyoto (JP)

(*) Notice: Subject to any disclaimer, the term of this patent is extended or adjusted under 35 U.S.C. 154(b) by 553 days.

(21) Appl. No.: 14/354,339

(22) PCT Filed: Sep. 27, 2012

(86) PCT No.: PCT/JP2012/074956
§ 371 (c)(1),
(2) Date: Apr. 25, 2014

(87) PCT Pub. No.: WO2013/065430
PCT Pub. Date: May 10, 2013

(65) Prior Publication Data
US 2014/0299360 A1    Oct. 9, 2014

(30) Foreign Application Priority Data

Oct. 31, 2011 (JP) ................................ 2011-238121

(51) Int. Cl.
*H05K 1/09* (2006.01)
*H05K 3/10* (2006.01)
(Continued)

(52) U.S. Cl.
CPC .............. *H05K 1/09* (2013.01); *G06F 3/044* (2013.01); *H05K 3/027* (2013.01);
(Continued)

(58) Field of Classification Search
CPC ........ H05K 1/09; H05K 1/0274; H05K 3/022; H05K 3/027; H05K 2203/107;
(Continued)

(56) References Cited

U.S. PATENT DOCUMENTS 4,258,100 A * 3/1981 Fujitani ................ B23K 35/226
219/91.21
2010/0206614 A1* 8/2010 Park ...................... H01H 13/88
174/126.1
(Continued)

FOREIGN PATENT DOCUMENTS

JP    2010-140859 A    6/2010
JP    2011-086413 A    4/2011
JP    2011-096518 A    5/2011

OTHER PUBLICATIONS

PCT, "International Search Report for International Application No. PCT/JP2012/074956".

*Primary Examiner* — Sherman Ng
(74) *Attorney, Agent, or Firm* — Manabu Kanesaka

(57) ABSTRACT

In a conductive sheet using a metal nanofiber, metal migration in a visible conductive pattern is eliminated. Also, the intervals of the conductive portion (separate sheet terminal) are shortened. On a substrate (26) is a conductive sheet (10), formed from a transparent conductive pattern (11) and a visible conductive pattern (16). The transparent conductive pattern comprises a first nanofiber layer (12) that is a layer including a metal nanofiber, and a first heat-insulating layer (29) adjacent to the first nanofiber layer. The visible conductive pattern (16) forms an underlayer pattern from a second nanofiber layer (17) that is a layer including a metal nanofiber, and a second heat-insulating layer (27) adjacent to the second nanofiber layer; and a top-layer pattern comprising a paste layer (18) that is a layer including a metal paste laminated on the underlayer pattern. The second heat-insulating layer (27) is a conductive sheet that is a layer including a metal nanofiber cut to a minimum size. The visible conductive pattern (16) forms a water-shielding layer (21) on the underlayer pattern, and forms the top-layer pattern on the water-shielding layer.

9 Claims, 6 Drawing Sheets

(51) Int. Cl.
*G06F 3/044* (2006.01)
*H01H 1/029* (2006.01)
*H05K 1/02* (2006.01)
*H05K 3/02* (2006.01)

(52) U.S. Cl.
CPC ... *G06F 2203/04103* (2013.01); *H01H 1/029* (2013.01); *H01H 2201/03* (2013.01); *H01H 2209/038* (2013.01); *H05K 1/0274* (2013.01); *H05K 3/022* (2013.01); *H05K 2203/107* (2013.01); *Y10T 29/49155* (2015.01)

(58) Field of Classification Search
CPC .............. Y10T 29/49155; H01H 1/029; H01H 2201/03; H01H 2209/038; G06F 3/044; G06F 2203/04103
USPC ................................... 174/251, 257; 29/846
See application file for complete search history.

(56) References Cited

U.S. PATENT DOCUMENTS

| | | | |
|---|---|---|---|
| 2014/0209469 A1* | 7/2014 | Scott ..................... | C25D 1/04 205/76 |
| 2016/0073494 A1* | 3/2016 | Uchida ............... | H01L 51/0021 345/173 |
| 2016/0195948 A1* | 7/2016 | Tomohisa ............... | G06F 3/044 345/173 |

* cited by examiner

CONDUCTIVE SHEET AND METHOD FOR FABRICATING THE SAME

RELATED APPLICATIONS

The present application is National Phase of International Application No. PCT/JP2012/074956 filed Sep. 27, 2012, and claims priority from Japanese Application No. 2011-238121, filed Oct. 31, 2011.

TECHNICAL FIELD

The present invention relates to a conductive sheet used for devices, such as, but not limited to, touch panels, and a method for fabricating the same.

BACKGROUND ART

In the conventional technology, there has been proposed a conductive sheet fabricated by disposing a certain pattern of layer containing an electrically conductive nanofiber, specifically a metal nanofiber, on a substrate of resins, glasses and the like (for example, those disclosed in Patent literature 1).

FIG. 8(a) is a plan view of a conventional conductive sheet. FIG. 8(b) is a magnified cross-sectional view of the conductive sheet taken along the plane indicated by the arrow 76 in FIG. 8(a). The conductive sheet 110 has a terminal part 131a, which contains discrete terminals 132a, 132b and 132c, on its periphery.

The terminal part 131a is formed of a conventional visible conductor pattern 116 that comprises a bottom pattern formed by disposing second nanofiber layers 17 on a substrate 26 and a top pattern formed by disposing paste layers 18 on the bottom pattern.

The second nanofiber layers 17 contain, for example, silver nanofiber, and the paste layers 18 contain, for example, silver paste. The paste layers 18 on the second nanofiber layers complement the function of the second nanofiber layers constituting the terminal part 131a in order to increase the electric conductivity (decrease the electric resistance) of the terminal part 131a. The visible conductor pattern (of the terminal part 131a) formed on the periphery of the conductive sheet 110 does not influence on the design or handling of a touch panel to which the conductive sheet 110 is incorporated, because the periphery of the conductive sheet 110 incorporated in a touch panel is covered with the flame of the touch panel.

Second thermally-formed insulator layers 127 are disposed between adjacent second nanofiber layers 17, and prevent short circuit between the second nanofiber layers 17. The second thermally-formed insulator layers 127 do not have electrical conductivity as the metal nanofiber in the layers is divided into fine particles by irradiation processing.

A flexible printed circuit is connected to the terminal part 131a by means of, for example, an anisotropic conductive adhesive.

CITATION LIST

Patent Literature

PTL 1: Japanese patent publication laid open 2010-140859

SUMMARY OF INVENTION

Technical Problem

A conventional conductive sheet has a terminal part at which second nanofiber layers functioning as conductors are disposed alternately with second thermally-formed insulator layers that make the second nanofiber layers spaced apart in a short distance. Although the second thermally-formed insulator layers do not have electrical conductivity, the layers contain finely-divided metal nanofiber that may ionize during a long-term use of the conductive sheet. Ionized metal nanofiber causes metal migration at the terminal part of the conductive sheet and may lead to short circuit between discrete terminals.

At the terminal part of a conventional conductive sheet connected with a flexible printed circuit, second thermally-formed insulator layers directly contact an anisotropic conductive adhesive used for the connection. The direct contact between the anisotropic conductive adhesive and second thermally-formed insulator layers generates a small electric current flowing between discrete terminals at the terminal part through the anisotropic conductive adhesive and finely-divided metal nanofiber in the second thermally-formed insulator layers so as to decrease the insulation resistance between the discrete terminals. The decreased insulation resistance may lead to short circuit between the discrete terminals.

The distance between the discrete terminals at the terminal part of a conventional conductive sheet, for example, the distance between the terminals 132a and 132b, needs to be enlarged to some extent, though the enlargement disturbs miniaturization of a flexible printed circuit to be connected with the conductive sheet. One of the reasons of such enlargement is prevention of metal migration that is accelerated by smaller distance between discrete terminals. Another reason of the enlarged distance between discrete terminals is making a space for misalignment of the paste layer patterns which should be printed correctly on the patterns of the second nanofiber layers.

The problems to be solved by the present invention are elimination of metal migration in a visible conductor pattern of a conductive sheet containing metal nanofiber, decreasing the distance between conductors (discrete terminals of a conductive sheet), and providing a method for fabricating such conductive sheet.

Solution to Problem

A conductive sheet of the present invention comprises: a transparent conductor pattern comprising a first nanofiber layer containing metal nanofiber and a first thermally-formed insulator layer abutting the first nanofiber layer; and a visible conductor pattern comprising a bottom pattern formed of a second nanofiber layer containing metal nanofiber and a second thermally-formed insulator layer containing finely-divided metal nanofiber and abutting the second nanofiber layer, and a top pattern comprising a paste layer containing metal paste and disposed over the bottom pattern, said visible conductor pattern containing a waterproof layer that is formed on said bottom pattern so as to cover the bottom pattern, and said top pattern being formed on said waterproof layer.

A conductive sheet according to one preferable embodiment of the present invention may employ silver nanofiber for said metal nanofiber and silver paste for said metal paste.

A conductive sheet according to another preferable embodiment of the present invention may have a conductor wire comprising said visible conductor pattern.

A conductive sheet with wiring of the present invention comprises a conductive sheet of the present invention and a flexible printed circuit, wherein said conductive sheet has a terminal part comprising said visible conductor pattern and being electrically connected to a joining terminal of the flexible printed circuit.

A touch panel of the present invention comprises a conductive sheet with wiring of the present invention as an electrode thereof.

A method for fabricating the conductive sheet of the present invention includes a process for fabricating said visible conductor pattern comprising the following steps of:
(a) disposing a second nanofiber layer containing metal nanofiber on a substrate;
(b) disposing a waterproof layer on the second nanofiber layer disposed in the step (a);
(c) disposing a paste layer containing metal paste on the waterproof layer disposed in the step (b); and
(d) forming said bottom pattern and top pattern by irradiating the layers of the second nanofiber layer, waterproof layer and paste layer on the substrate completed in the step (c) from above the paste layer to cut the metal nanofiber in the second nanofiber layer and burn out the metal paste in the paste layer.

The present invention, preferable embodiments of the present invention and the elements contained therein can be combined as far as possible to work the invention.

Advantageous Effects of Invention

The conductive sheet of the present invention includes, in addition to other elements of the invention, a bottom pattern comprising a second nanofiber layer and a second thermally-formed insulator layer, and also a waterproof layer covering the bottom pattern to prevent moisture intrusion into the second nanofiber layer and second thermally-formed insulator layer thereby minimizing metal migration. Thus the conductive sheet of the present invention has improved durability with minimum short circuit due to metal migration. The conductive sheet of the present invention enables smaller distance between visible conductor patterns and reduced sizes of the conductive sheet and a device to which the conductive sheet is incorporated.

The conductive sheet with wiring of the present invention is durable and the conductive sheet and the wiring, i.e., a flexible printed circuit, have reduced-size terminal parts, owing to the conductive sheet of the present invention employed.

The touch panel of the present invention is durable and has a reduced-size connector to a circuit, owing to the conductive sheet with wiring of the present invention incorporated therein.

The method for fabricating the conductive sheet of the present invention includes, in addition to other elements of the present invention, the steps of layering the second nanofiber layer, waterproof layer and paste layer, and irradiating simultaneously the second nanofiber layer and the paste layer to form the visible conductor pattern so as to readily and efficiently fabricate waterproof layer. Thus the method is advantageous for fabricating a conductive sheet having visible conductor patterns spaced apart in a small distance and causing no metal migration.

DESCRIPTION OF EMBODIMENTS

The conductive sheet, conductive sheet with wiring, capacitive touch panel, and the method for fabricating the conductive sheet of the present invention will be further described referring to the figures. Some of the figures are schematically drawn with magnification of some elements for readily understanding the present invention. Thus some of the dimensions of or dimensional ratios between the elements may be different from that of the actual conductive sheets or devices. The dimensions, materials, shapes and relative positions of the members and parts described in the working examples of the present invention merely explain the present invention and do not intend to restrict the scope of the present invention unless otherwise specified. The numbers used as the signs may collectively represent parts, and alphabetical letters are sometimes added to such numbers for representing each of such parts.

Figure 1:
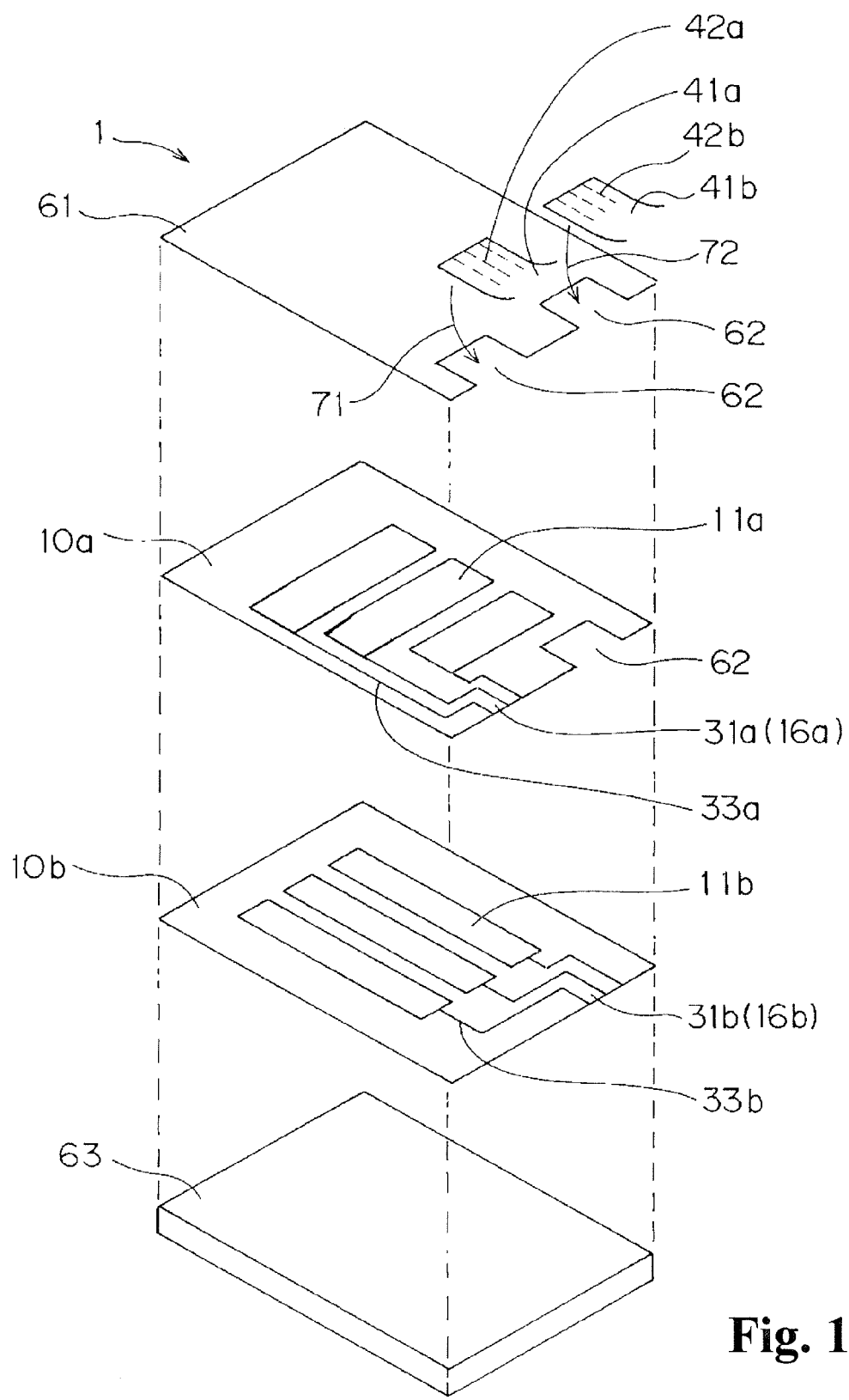
FIG. 1 is an exploded diagram of a touch panel of the present invention.

FIG. 1 is an exploded diagram of a touch panel 1 that is fabricated by layering a second detector conductive sheet 10b, first detector conductive sheet 10a, and protective film 61 in the order on a display panel 63. The display panel 63 is a liquid crystal display, though other known types of display may be employed for the display panel 63 without restriction.

The second detector conductive sheet 10b includes a transparent conductor pattern 11b. The transparent conductor pattern 11b includes three rectangular electrodes arranged along the longer side of the second detector conductive sheet 10b. A conductor wire 33b is routed from each of the three electrodes to the terminal part 31b of the sheet. The terminal part 31b comprises a visible conductor pattern 16b. In the present invention and this description, "transparent" refers to a property of a material allowing light to pass through and "visible" refers to a property of a material absorbing visible light.

The first detector conductive sheet 10a includes a transparent conductor pattern 11a. The transparent conductor pattern 11a includes three rectangular electrodes arranged along the shorter side of the first detector conductive sheet 10a. A conductor wire 33a is routed from each of the three electrodes to the terminal part 31a of the sheet. The terminal part 31a comprises a visible conductor pattern 16a.

The electrodes and control circuit of the touch panel are connected via flexible printed circuits (hereinafter referred to as FPC) 41a and 41b. The terminals 42a and 42b each at the respective end of the FPCs 41a and 41b are respectively connected to the terminal parts 31a and 31b of the conductive sheets. The FPCs 41a and 41b are adhered respectively to the terminal parts 31a and 31b with an anisotropic conductive adhesive. Cutouts 62 were made at the areas of the protective film 61 and the first detector conductive sheet 10a corresponding to the positions for adhering the FPCs to the terminal parts of the conductive sheets so as to readily connect the FPCs and the conductive sheets. The FPCs 41 are formed into a strip, and FIG. 1 shows only the outline of the terminal parts 42 of the FPCs 41.

A known system can be employed for the control system of the touch panel, for example, capacitive sensing. The diagrammatic representation of a control circuit is omitted.

Figure 2A:
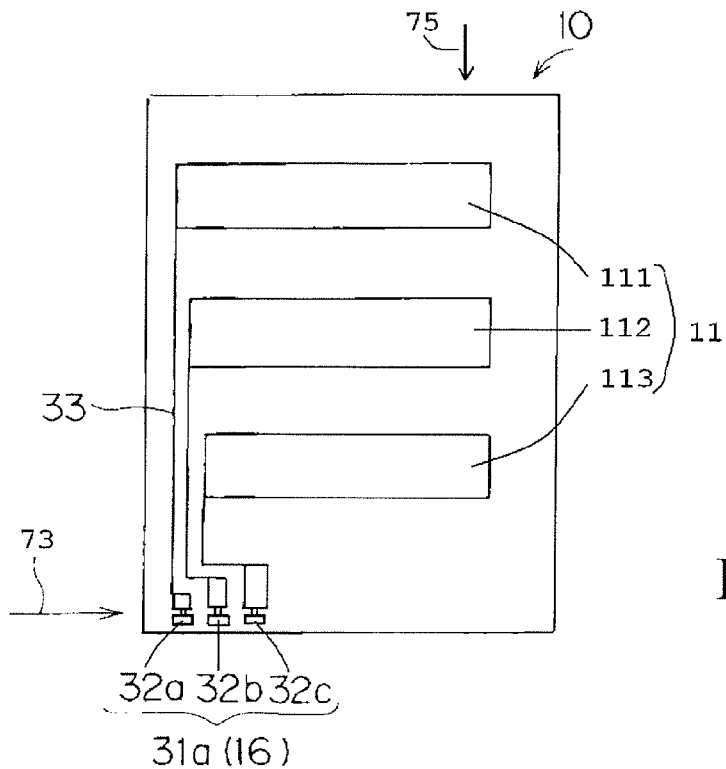
FIG. 2 is an illustrative diagram of a conductive sheet, where (a) is a plan view, (b) is a magnified cross-sectional view taken along the plane indicated by the arrow 73 in (a), and (c) is another cross-sectional view taken along the plane indicated by the arrow 75 in (a).
Figure 2B:
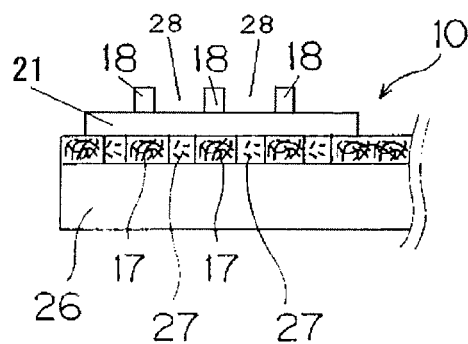
Figure 2C:
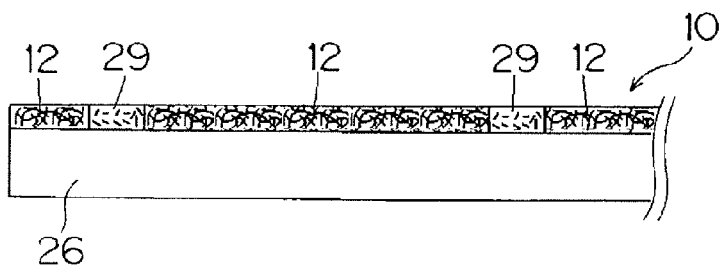
Figure 3:
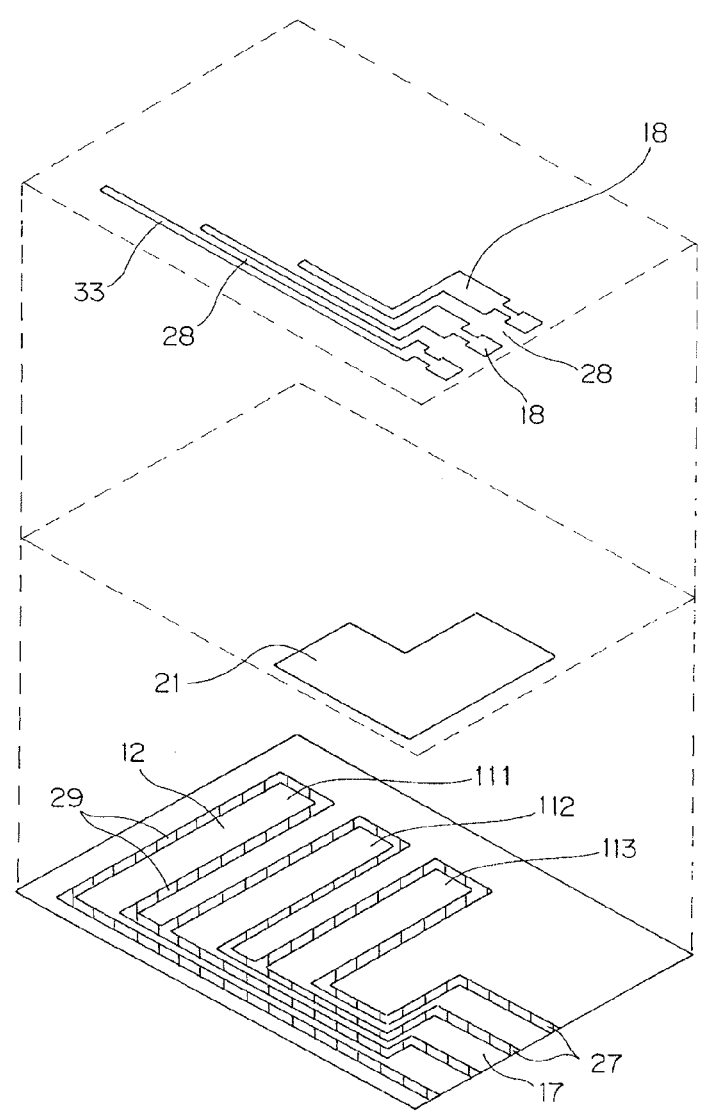
FIG. 3 is an exploded diagram of a conductive sheet.

FIG. 2 is an illustrative diagram of a conductive sheet 10, and FIG. 2(*a*) is a plan view of the conductive sheet 10. FIG. 2(*b*) is a magnified cross-sectional view taken along the plane indicated by the arrow 73 in FIG. 2(*a*), and FIG. 2(*c*) is a cross-sectional view taken along the plane indicated by the arrow 75 in FIG. 2(*a*). FIG. 3 is an exploded diagram of the conductive sheet.

A terminal part 31a is made at the periphery of the conductive sheet 10. Transparent electrodes 111, 112 and 113 are disposed at the center of the conductive sheet 10. The three transparent electrodes 111, 112 and 113 are rectangular and arranged along the shorter side of the conductive sheet 10. The three transparent electrodes 111, 112 and 113 are formed of the transparent conductor pattern.

The transparent electrodes 111, 112 and 113 are respectively connected to discrete terminals 32a, 32b and 32c via conductor wire 33. The terminal part 31a of the conductive sheet is formed of the visible conductor pattern 16. The conductor wire 33 may be formed of either the transparent conductor pattern or visible conductor pattern.

The structure of the visible conductor pattern will be described by referring to FIG. 2(*b*) and FIG. 3. The visible conductor pattern 16 comprises three layers. The first layer includes second nanofiber layers 17 and second thermally-formed insulator layers 27 disposed on a substrate 26. The second nanofiber layers 17 and the second thermally-formed insulator layers 27 abut each other on the same plane. The second nanofiber layers 17 constitute a bottom pattern having a certain planar shape.

The second layer is a waterproof layer 21 disposed on the second nanofiber layers 17 and the second thermally-formed insulator layers 27. Paste layers 18 and insulation gaps 28 are formed on the waterproof layer 21.

The waterproof layer 21 covers the bottom pattern, and the third layer is the paste layers 18 formed on the waterproof layer 21. The paste layers 18 constitute the top pattern that has the same planar shape as that of the bottom pattern. The parts abutting the paste layers 18 on the same plane are insulation gaps 28 which are actually voids. FIG. 2(*b*) shows three paste layers 18 separated apart by the insulation gaps 28.

The paste layers 18 of the conductive sheet of the present invention need not always be disposed into the same planar shape as that of the bottom pattern. The paste layers 18 of the conductive sheet of the present invention independently function as a conductor without depending on the second nanofiber layers 17. Thus the top pattern may be formed into a different planar shape from that of the bottom pattern.

The top pattern and bottom pattern of a conventional conductive sheet cooperate to function as conductors by supplementing the other's conductive performance. Therefore the top pattern is required to be disposed into the same planar shape as that of the bottom pattern as far as possible. Difference in the planar shape between the upper and bottom patterns increases the area constituted by the paste layer 18 and nanofiber layer 17 to increase the width of the terminal part of the conductive sheet so as to increase the area of the terminal part on the conductive sheet.

The conductive sheet of the present invention includes a waterproof layer 21 disposed between the lower and top patterns. The paste layers 18 alone function as conductors if the second nanofiber layers 17 and paste layers 18 contact at an area where the waterproof layer is not disposed. In this case, the top pattern may be disposed into a different shape from that of the bottom pattern.

The transparent conductor pattern will be described by referring to FIG. 2(*c*) and FIG. 3. The transparent conductor pattern 11 comprises first nanofiber layers 12 and first thermally-formed insulator layers 29 disposed on the substrate 26. The first nanofiber layers 12 are formed into a certain planar shape to constitute the transparent electrode mentioned above, and abut the first thermally-formed insulator layers 29 on the same plane. The visible conductor pattern 16 and the transparent conductor pattern 11 are disposed on the same plane.

The waterproof layer 21 prevents water intrusion into the bottom pattern. Ideally the waterproof layer 21 should cover the whole surface of the bottom pattern, in other words, the waterproof layer 21 should extend beyond the outline of the bottom pattern to some extent.

However, the waterproof layer 21 prevents not only water intrusion but also electric conduction, and the waterproof layer 21 covering the bottom pattern prevents electric conduction between the paste layers 18 and the second nanofiber layers 17. It is preferable to make the waterproof layer 21 cover the bottom pattern except the area where the paste layers 18 and the second nanofiber layers 17 directly contact to each other.

Figure 4:
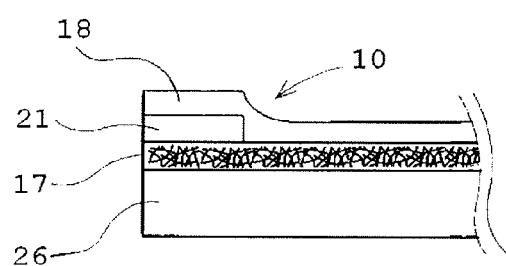
FIG. 4 is a magnified cross-sectional view of a conductive sheet showing the contact between a paste layer 18 and a second nanofiber layer 17.

FIG. 4 is a magnified cross-sectional view of the conductive sheet showing the direct contact between a paste layer 18 and a second nanofiber layer 17. The outline of the waterproof layer 21 shown in FIG. 4 draws back to the inside the outline of the second nanofiber layer 17 to allow a part of the second nanofiber layer 17 to come out. The paste layer 18 extends beyond the outline of the waterproof layer 21 to directly contact the second nanofiber layer 17. The inside mentioned here means an area surrounded by an outline and the outside mentioned here means the area beyond an outline.

Metal migration occurs under a condition where (1) moisture and (2) electric potential difference exist. The visible conductor pattern of the present invention does not cause metal migration owing to the waterproof layer included therein that prevents water intrusion into the second nanofiber layers and the second thermally-formed insulator layers.

The process for fabricating the visible conductor pattern will be described. FIG. 5 is an illustrative diagram showing a process for fabricating a visible conductor pattern. The process enables, for example, fabrication of the conductor wire of a conductive sheet.

At first, a second nanofiber layer 17 containing metal nanofiber is disposed on a substrate 26 as shown in FIG. 5(*a*). Then a waterproof layer 21 is disposed on the second nanofiber layer 17 as shown in FIG. 5(*b*), and a paste layer 18 is disposed on the waterproof layer 21 as shown in FIG. 5(*c*).

Then the second nanofiber layer 17, waterproof layer 21 and paste layer 18 on the substrate is irradiated with a laser 51 from above the paste layer 18. The irradiation cuts metal nanofiber in the second nanofiber layer, partially removes the paste layer 18 to form the lower and top patterns, and thereby fabricates a visible conductor pattern.

The process for fabricating a visible conductor pattern mentioned above enables fabrication of a conductive sheet having a transparent conductor pattern and a visible conductor pattern as described below.

Figure 5A:
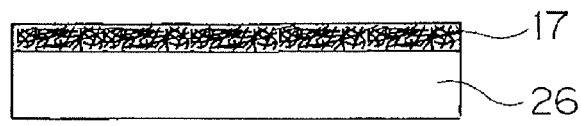
FIG. 5 is an illustrative diagram showing a process for fabricating a visible conductor pattern of a conductive sheet.

A first nanofiber layer and a second nanofiber layer are simultaneously formed at the step shown in FIG. 5(a). The first nanofiber layer 12 can be formed at any area on the substrate 26 except the area where the second nanofiber 17 is formed. The first and second nanofiber layers are formed of the same material and into the same thickness simultaneously in the same operation.

Figure 5B:
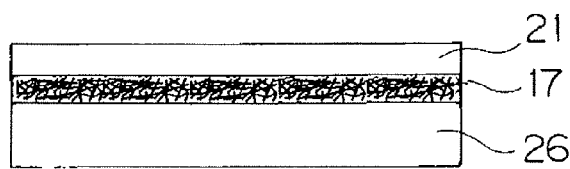
Figure 5C:
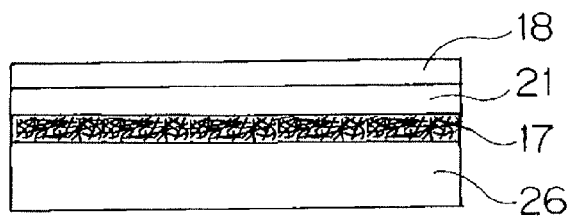
Figure 5D:
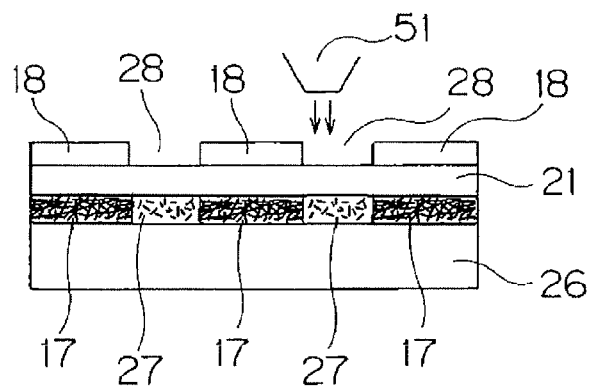

Then layers are added on the visible conductor pattern 16, in other words, on the second nanofiber layer 17, as shown in FIG. 5(b) and FIG. 5(c). At the step in FIG. 5(d), the second thermally-formed insulator layers 27 are formed by irradiation, and the first thermally-formed insulator layers 29 are simultaneously formed by irradiating the transparent conductor pattern 11, in other words, the first nanofiber layer 12. Thus a conductive sheet having a transparent conductor pattern and a visible conductor pattern is fabricated in the process mentioned above.

YAG laser is an example of lasers and irradiates beam with a spot size of several tens micrometer. The wavelength for the irradiation with YAG laser should range from 1200 nm to 350 nm, preferably from 1100 nm to 400 nm. Irradiation within the wavelength range does not burn the waterproof layer and substrate to make them remain after irradiation, and generates only a small quantity of heat which does not burn out the conductive sheet.

Irradiation applies a proper amount of energy (heat) to metal nanofiber. The energy cuts the metal nanofiber, and simultaneously burns and removes some part of the paste layer. Other sources of radiation may be employed for the irradiation.

The waterproof layer 21 should be transparent, because a transparent waterproof layer 21 survives the irradiation as it transmits the energy of radiation. On the contrary, opaque waterproof layer absorbs the energy of radiation and is consequently burnt by YAG laser.

The materials for the waterproof layer include acrylic resins, vinyl chloride resins, polyurethane resins, epoxy resins, melamine resins and the like. Of those resins, polyurethane resins, epoxy resins and melamine resins are preferable for their transparency and waterproof performance. The waterproof layer can be formed by gravure coating, roller coating, comma coating, gravure printing, screen printing, offset printing and the like.

The thickness of the waterproof layer should range from 1 μm to 30 μm, preferably from 5 μm to 20 μm. A waterproof layer having a thickness of at least 1 μm minimizes metal migration. A waterproof layer having a thickness at most 30 μm allows a protective film 61 attached on the conductive sheet to fit the bump formed by the waterproof layer and paste layer along the outline of the waterproof layer, and thus prevents void formation between the conductive sheet and the protective film to prevent poor appearance of resultant conductive sheet due to the void.

In addition, the thickness of the waterproof layer 21 should be less than 10 times thickness of the paste layer 18, preferably less than 4 times thickness. A waterproof layer 21 having such thickness prevents crack formation at the contact between the second nanofiber layers 17 and paste layers 18 along the outline of the waterproof layer 21.

The second nanofiber layers 17 comprise a metal nanofiber and a binder resin, such as acrylic, polyester, polyurethane and polyvinyl chloride resins and the like. The second nanofiber layers 17 can be formed by means of a versatile printing method such as gravure printing, offset printing, screen printing and the like, or coating with a slot die coater.

The metal nanofiber includes the nanofibers of gold, silver, platinum, copper, palladium and the like. Those metal nanofibers are manufactured by applying an energized needle tip to a nanofiber precursor prepared by coating a support comprising, for example, a zirconium phosphate compound, with a metal ion such as gold, silver, platinum, copper and palladium ions and the like. Of those metal nanofibers, silver nanofiber is preferable for its high electrical conductivity, lower cost and translucency. The silver nanofiber should have a diameter ranging from 10 nm to 100 nm and a length ranging from 1 μm to 200 μm.

The thickness of the second nanofiber layers 17 can be selected within the range from several tens nanometers to several hundred nanometers, and a second nanofiber layer having such thickness has sufficient strength and is soft enough to be readily processed.

The materials and fabrication method for the first nanofiber layers 12 are the same as that for the second nanofiber layers 17.

The second thermally-formed insulator layers 27 comprise a metal nanofiber and a binder resin, for which acrylic, polyester, polyurethane and polyvinyl chloride resins and the like can be employed.

The metal nanofiber constituting the second thermally-formed insulator layers 27 has dimensions ranging from $1/10$ to $1/1000$ of the dimensions of the metal nanofiber constituting the first and second metal nanofiber layers. The strands of the metal nanofiber constituting the second thermally-formed insulator layers 27 exist independently of each other in the layers to decrease the electric conductivity of the second thermally-formed insulator layers 27. On the contrary, the strands of the metal nanofiber constituting the first nanofiber layer tangle, and similarly the strands of the metal nanofiber constituting the second nanofiber layer tangle.

The second thermally-formed insulator layers 27 are fabricated in the following process. At first, a material being the same as that for the second nanofiber layer is disposed on a substrate by means of a versatile printing method such as gravure printing, offset printing, screen printing and the like, or coating with a slot die coater, and the disposed layer is then irradiated with a device such as YAG laser to heat the metal nanofiber in the layer.

The thickness of the second thermally-formed insulator layer 27s is the same as that of the first nanofiber layer and the second metal nanofiber layer.

The paste layers 18 comprise metal particles and a binder resin, for which acrylic, polyester, polyurethane and polyvinyl chloride resins and the like are employed. Of metal particles, silver is the most preferable for its good electrical conductivity and low cost. The paste layer has a thickness ranging from 1 μm to 30 μm, and is formed by gravure coating, roller coating, comma coating, gravure printing, screen printing, offset printing and the like.

The materials for the substrate 26 include films of acrylic, polycarbonate, polyester, polybutylene terephthalate, polypropylene, polyamide, polyurethane, polyvinyl chloride and polyvinyl fluoride resins and the like, and glasses. The thickness of the substrate 26 can be selected within the range from 5 μm to 800 μm. A substrate having such thickness has sufficient strength and is soft enough to be readily processed.

The visible conductor pattern having a waterproof layer mentioned above is applicable not only for forming a terminal part of a conductive sheet but also for forming conductor wire. Conductor wire comprising a visible conductor pattern having a waterproof layer enables decreased area of the rim of a conductive sheet without a risk of metal migration.

EXAMPLE

Experiment 1

A conductive sheet model 81 of Experiment 1 was fabricated as described below. The conductive sheet model 81 provides Example 1.

A 50-μm thick biaxially-oriented polyethylene terephthalate film was employed for the substrate. A silver nanofiber material (ClearOhm®, produced by Cambrios Technologies Corp.) was disposed on the whole surface of the substrate to form a metal nanofiber layer.

Figure 6:
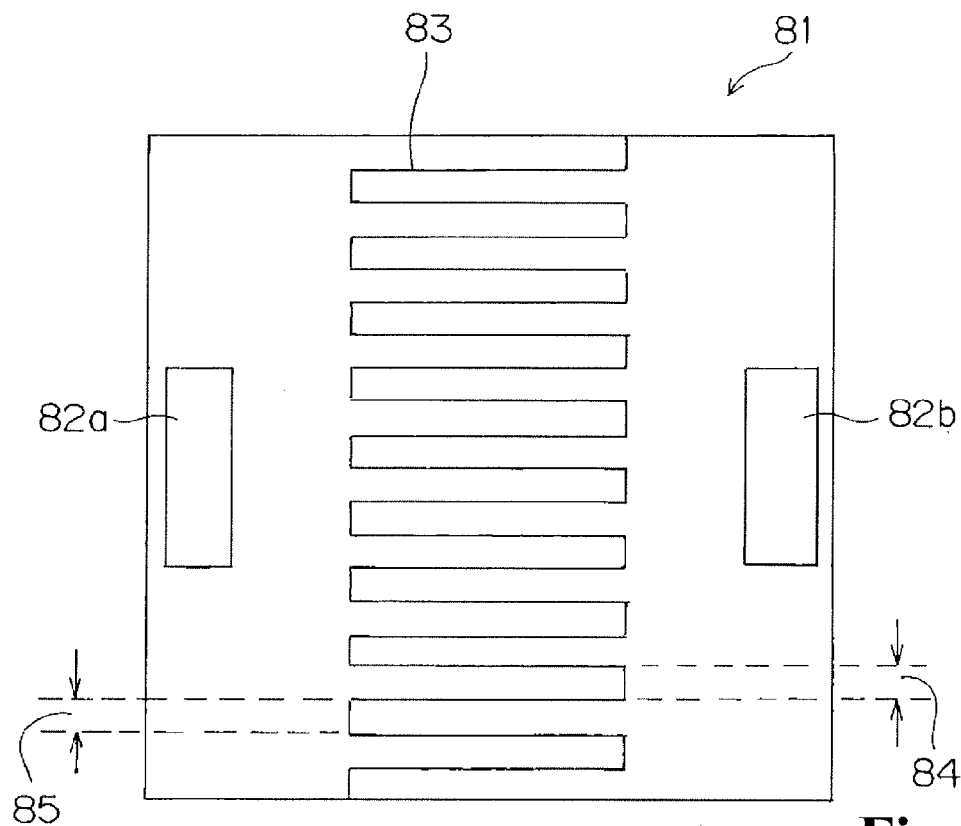
FIG. 6 is a plan view of a conductive sheet model 81 of Experiment 1.

Then a polyurethane resin was disposed on the metal nanofiber layer to form a 15-μm thick waterproof layer. FIG. 6 is a plan view of the conductive sheet model 81. The waterproof layer was not formed on the electrode regions 82a and 82b. As shown in FIG. 6, the two electrode regions, 82a and 82b, were respectively formed at the opposite ends of the sheet. Each of the electrode regions 82a and 82b has a dimension of 10 mm by 30 mm, and the linear distance between the two electrode regions was 80 mm.

Then the electrode regions 82a and 82b were covered with silver paste (DW-114L-1, produced by Toyobo Co., Ltd.) 5 μm thick to form electrodes.

Then the metal nanofiber layer was etched into comb-shaped pattern with a YAG laser to form a thermally-formed insulator line 83. The comb teeth of the comb-shaped pattern were arranged in 5 mm intervals (indicated by the arrow 84) and the width of each comb tooth (indicated by the arrow 85) was 5 mm. The width of the thermally-formed insulator line 83 was 0.1 mm. The conductive sheet model of Example 1 was fabricated in the process mentioned above. The silver nanofiber material, epoxy resin and silver paste were disposed on the substrate with a gravure printing machine. The wave length of the YAG laser employed was 1064 μm.

Examples 2 and 3, and Comparative Examples 1 and 2

Conductive sheet models were fabricated according to the method of Example 1 except that different thickness and resins were employed for waterproof layers. In addition, the conductive sheet model of Comparative example 1 does not have a waterproof layer.

Metal migration prevention performance of Examples 1 to 3 and Comparative examples 1 and 2

The models of Examples 1 to 3 and Comparative examples 1 and 2 were tested in the following procedure. Both electrodes of a conductive sheet model were connected to power source to be energized with 20 V, and the time until the sheet model short-circuits was measured. The measurement was carried out at 60° C. and 95% RH (Relative Humidity). The result is shown in Table 1.

TABLE 1

| | Waterproof layer | | Testing |
|---|---|---|---|
| | Material | Thickness (μm) | Time until short circuit (min) |
| Example 1 | Polyurethane | 6.7 | 180 |
| Example 2 | Polyurethane | 15 | 300 |
| Example 3 | Polyurethane | 27 | 560 |

TABLE 1-continued

| | Waterproof layer | | Testing |
|---|---|---|---|
| | Material | Thickness (μm) | Time until short circuit (min) |
| Comparative example 1 | None | — | 5 |
| Comparative example 2 | Low-density polyester resin | 15 | 30 |

Experiment 2

A conductive sheet model 98 of Experiment 2 was fabricated as follows. The conductive sheet model 98 provides Example 4.

A 50-μm thick biaxially-oriented polyethylene terephthalate film was employed for the substrate. A silver nanofiber material (ClearOhm®, produced by Cambrios Technologies Corp.) was disposed on the whole surface of the substrate to form a metal nanofiber layer.

Figure 7:
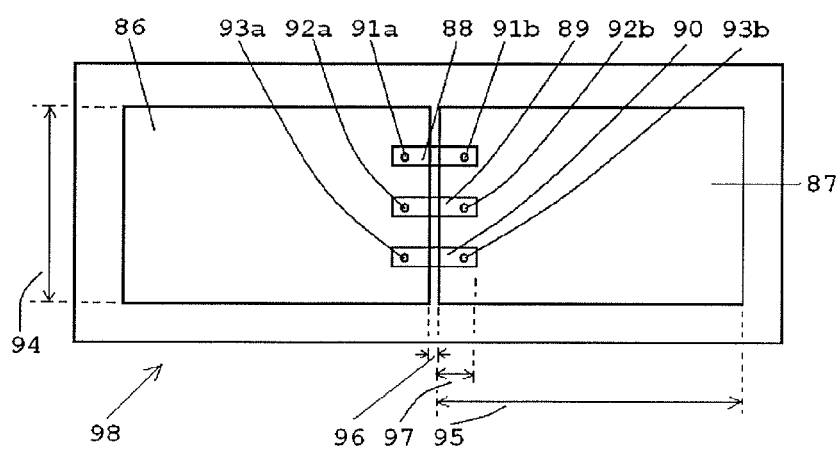
FIG. 7 is a plan view of a conductive sheet model 98 of Experiment 2.
Figure 8A:
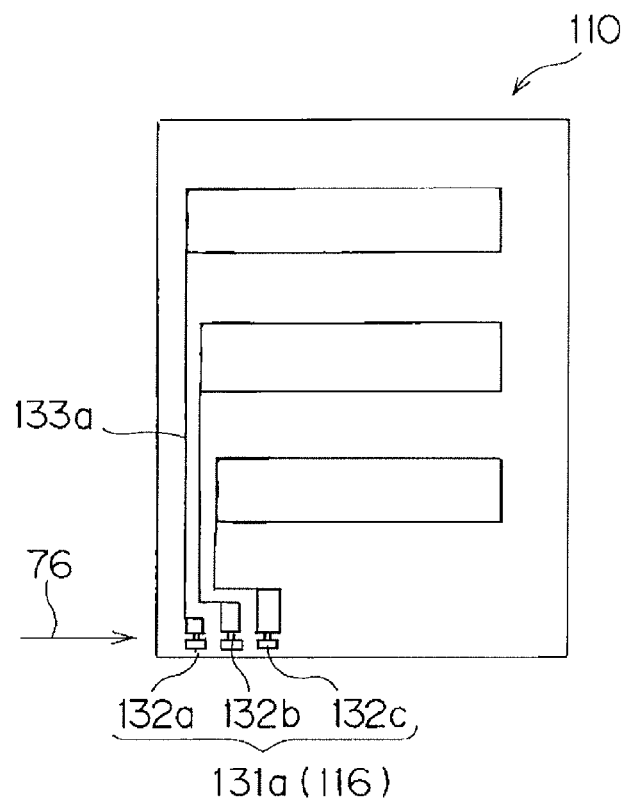
FIG. 8 is an illustrative diagram of a conventional conductive sheet, where (a) is a plan view, and (b) is a magnified cross-sectional view taken along the plane indicated by the arrow 76 in (a).
Figure 8B:
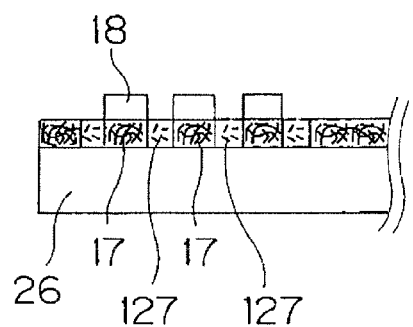

FIG. 7 is a plan view of the conductive sheet model 98. On the metal nanofiber layer, a polyurethane resin was disposed to form two waterproof layers 86 and 87. The waterproof layers 86 and 87 were formed into 15-μm thick rectangles of 20 mm (indicated by the arrow 94) by 50 mm (indicated by the arrow 95) separated apart in a distance of 1 mm (indicated by the arrow 96). The waterproof layer was not formed at the periphery of the substrate and at the electrode regions 88, 89 and 90.

The electrode regions were formed into rectangles of 0.1 mm by 21 mm, and 10 mm out of the 21 mm overlapped the waterproof layer 87 (indicated by the arrow 97). Silver paste (DW-114L-1, produced by Toyobo Ld.) was disposed 5 μm thick to cover the electrode regions 88, 89 and 90 to form electrodes.

Example 5 and Comparative Examples 3, 4 and 5

Conductive sheet models were fabricated according to the method of Example 4 except that different thickness and resins were employed for waterproof layers.

Crack generation of Examples 4 and 5 and Comparative examples 3, 4 and 5

The models of Examples 4 and 5 and Comparative examples 3, 4 and 5 were tested in the following procedure.

The electric resistance of the electrodes of each conductive sheet model was measured. The electric resistance was measured between the points 91a and 91b, between the points 92a and 92b and between the points 93a and 93b. The three resistance values were calculated into an arithmetic mean, which was defined to be the initial resistance.

Then each conductive sheet model was wound on an 8-mm diameter cylinder and unwound repeatedly 10 times. After the experiment, the electric resistance of the sheet model was measured in the same manner as that for the initial resistance. The electric resistance was measured between the points 91a and 91b, between the points 92a and 92b and between the points 93a and 93b. The three resistance values were calculated into an arithmetic mean, which was defined to be the resistance after the experiment.

The ratio of the resistance after the experiment to the initial resistance was calculated by the following expression.

$R/R_0$=Resistance after the experiment $(R)$/Initial resistance $(R_0)$

Based on the values of $R/R_0$ mentioned above, crack generation in the electrodes of each model was classified by the following criteria and shown in Table 2.

○: $1 \leq R/R_0 < 1.1$
Δ: $1.1 \leq R/R_0 < 1.2$
x: $1.2 \leq R/R_0$

TABLE 2

|  | Waterproof layer | | Testing Crack generation |
|---|---|---|---|
|  | Material | Thickness (μm) |  |
| Example 4 | Polyurethane | 15 | ○ |
| Example 5 | Polyurethane | 6.7 | ○ |
| Comparative example 3 | Polyurethane | 27 | Δ |
| Comparative example 4 | Polyurethane | 35 | Δ |
| Comparative example 5 | Polyurethane | 50 | X |

Cracks were generated at the contact between the electrode (silver paste layer) and silver nanofiber layer along the outline of the waterproof layer.

REFERENCE SIGNS LIST

1 Touch panel
10 Conductive sheet
10a First detector conductive sheet
10b Second detector conductive sheet
11 Transparent conductor pattern
12 First nanofiber layer
16 Visible conductor pattern
17 Second nanofiber layer
18 Paste layer
21 Waterproof layer
26 Substrate
27 Second thermally-formed insulator layer
28 Insulation gap
29 First thermally-formed insulator layer
31, 31a, 31b Terminal part of a conductive sheet
32a, 32b, 32c Discrete terminals
33, 33a, 33b Conductor wire
41a, 41b Flexible printed circuit
42 Terminal part of the circuit
51 Laser
61 Protective film
62 Cutout
63 Display panel
81 Conductive sheet model
82a, 82b Electrode regions
83 Thermally-formed insulator line
86, 87 Waterproof layer
88, 89, 90 Electrode region
98 Conductive sheet model
110 Conventional conductive sheet
116 Conventional visible conductor pattern

The invention claimed is:

1. A conductive sheet comprising:
a transparent conductor pattern comprising a first nanofiber layer containing metal nanofiber and a first thermally-formed insulator layer abutting the first nanofiber layer; and
a visible conductor pattern comprising a bottom pattern formed of a second nanofiber layer containing metal nanofiber and a second thermally-formed insulator layer containing finely-divided metal nanofiber and abutting the second nanofiber layer, and a top pattern comprising a paste layer containing metal paste and disposed over the bottom pattern, said visible conductor pattern containing a waterproof layer that is formed on said bottom pattern so as to cover the bottom pattern, and said top pattern being formed on said waterproof layer.

2. The conductive sheet according to claim 1, wherein silver nanofiber is employed for said metal nanofiber and silver paste is employed for said metal paste.

3. The conductive sheet according to claim 1, wherein a conductor wire of the conductive sheet comprises said visible conductor pattern.

4. The conductive sheet according to claim 2, wherein a conductor wire of the conductive sheet comprises said visible conductor pattern.

5. A conductive sheet with wiring comprising the conductive sheet according to claim 1 and a flexible printed circuit, wherein said conductive sheet has a terminal part comprising said visible conductor pattern and being electrically connected to a joining terminal of the flexible printed circuit.

6. A conductive sheet with wiring comprising the conductive sheet according to claim 2 and a flexible printed circuit, wherein said conductive sheet has a terminal part comprising said visible conductor pattern and being electrically connected to a joining terminal of the flexible printed circuit.

7. A touch panel comprising the conductive sheet with wiring according to claim 5 as an electrode thereof.

8. A touch panel comprising the conductive sheet with wiring according to claim 6 as an electrode thereof.

9. A method for fabricating the conductive sheet according to claim 1 including a process for fabricating said visible conductor pattern comprising the following steps of:
(a) disposing a second nanofiber layer containing metal nanofiber on a substrate;
(b) disposing a waterproof layer on the second nanofiber layer disposed in the step (a);
(c) disposing a paste layer containing metal paste on the waterproof layer disposed in the step (b); and
(d) forming said bottom pattern and top pattern by irradiating the layers of the second nanofiber layer, waterproof layer and paste layer on the substrate completed in the step (c) from above the paste layer to cut the metal nanofiber in the second nanofiber layer and burn out the metal paste in the paste layer.

* * * * *